United States Patent
Lee et al.

(10) Patent No.: US 8,614,126 B1
(45) Date of Patent: Dec. 24, 2013

(54) METHOD OF MAKING A THREE-DIMENSIONAL MEMORY ARRAY WITH ETCH STOP

(75) Inventors: Yao-Sheng Lee, Tampa, FL (US); Johann Alsmeier, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/586,413

(22) Filed: Aug. 15, 2012

(51) Int. Cl.
*H01L 21/8238* (2006.01)

(52) U.S. Cl.
USPC .................. 438/257; 257/E29.309; 438/258

(58) Field of Classification Search
USPC ................ 257/316–326, E21.209, E29.309; 438/257–267
See application file for complete search history.

(56) References Cited

U.S. PATENT DOCUMENTS

| | | |
|---|---|---|
| 6,953,697 B1 | 10/2005 | Castle et al. |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,450,176 B2 * | 5/2013 | Son et al. ...................... 438/261 |
| 2007/0210338 A1 | 9/2007 | Orlowski |
| 2007/0252201 A1 | 11/2007 | Kito et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 * | 6/2010 | Kim et al. ...................... 257/316 |

(Continued)

FOREIGN PATENT DOCUMENTS

WO    WO02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Matthew W Such
*Assistant Examiner* — Ali Naraghi
(74) *Attorney, Agent, or Firm* — The Marbury Law Group PLLC

(57) ABSTRACT

A three dimensional memory device including a substrate and a semiconductor channel. At least one end portion of the semiconductor channel extends substantially perpendicular to a major surface of the substrate. The device also includes at least one charge storage region located adjacent to semiconductor channel and a plurality of control gate electrodes having a strip shape extending substantially parallel to the major surface of the substrate. The plurality of control gate electrodes include at least a first control gate electrode located in a first device level and a second control gate electrode located in a second device level located over the major surface of the substrate and below the first device level. The device also includes an etch stop layer located between the substrate and the plurality of control gate electrodes.

14 Claims, 5 Drawing Sheets

(56) References Cited

U.S. PATENT DOCUMENTS

| | | | |
|---|---|---|---|
| 2010/0155818 A1* | 6/2010 | Cho et al. | 257/324 |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0031547 A1* | 2/2011 | Watanabe | 257/319 |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0001252 A1 | 1/2012 | Alsmeier et al. | |
| 2012/0146422 A1 | 6/2012 | Whang et al. | |
| 2012/0199897 A1* | 8/2012 | Chang et al. | 257/314 |
| 2012/0220088 A1* | 8/2012 | Alsmeier | 438/261 |
| 2012/0256247 A1 | 10/2012 | Alsmeier | |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

U.S. Appl. No. 13/443,287, Johann Alsmeier et al., "Vertical NAND Device with Low Capacitance and Silicided Word Lines," filed Apr. 10, 2012, Specification and drawings.

U.S. Appl. No. 13/478,483, Yao-Sheng Lee et al., Multi-Level Contact to a 3D Memory Array and Method of Making, filed May 23, 2012, Specification and drawings.

U.S. Appl. No. 13/544,328, Raghuveer Makala et al., "Three Dimensional NAND Device and Method of Charge Trap Layer Separation and Floating Gate Formation in the NAND Device," filed Jul. 9, 2012, Specification and drawings.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

Invitation to Pay Additional Fees, International Application No. PCT/US2013/049758, dated Oct. 10, 2013, 6pgs.

\* cited by examiner

METHOD OF MAKING A THREE-DIMENSIONAL MEMORY ARRAY WITH ETCH STOP

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a three dimensional memory device including a substrate and a semiconductor channel. At least one end portion of the semiconductor channel extends substantially perpendicular to a major surface of the substrate. The device also includes at least one charge storage region located adjacent to semiconductor channel and a plurality of control gate electrodes having a strip shape extending substantially parallel to the major surface of the substrate. The plurality of control gate electrodes include at least a first control gate electrode located in a first device level and a second control gate electrode located in a second device level located over the major surface of the substrate and below the first device level. The device also includes an etch stop layer located between the substrate and the plurality of control gate electrodes.

Another embodiment relates to a method of making a monolithic three dimensional NAND string. The method includes forming a sacrificial feature over a substrate, forming an etch stop layer over the sacrificial feature and forming a stack of alternating layers of a first material and a second material over the substrate. The first material includes a conductive or semiconductor control gate material and the second material includes an insulating material. The method also includes etching the stack to form a slit trench up to or only partially through the etch stop layer, filling the slit trench with a sacrificial material and etching the stack to form at least one opening in the stack at least to the etch stop layer using a first etch chemistry. The method also includes further etching the at least one opening through the etch stop layer to the sacrificial feature using a second etch chemistry in which the second etch chemistry is different from the first etch chemistry.

DETAILED DESCRIPTION

Figure 1A:
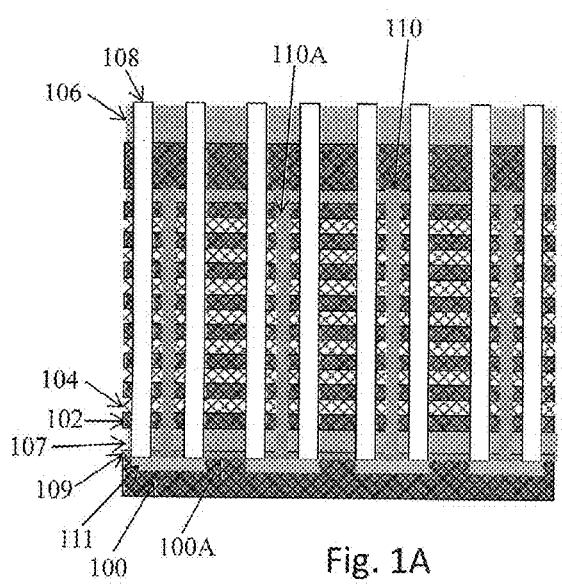
FIG. 1A is a schematic side cross sectional view illustrating a step in a method of making a three dimensional memory device according to an embodiment.

Embodiments include monolithic three dimensional NAND strings and methods of making three dimensional NAND strings. In an embodiment, the NAND string may have a U-shape (also known as a "pipe" shape) with two vertical channel wing portions connected with a horizontal channel connecting the wing portions. In one aspect, the U-shaped or pipe shaped channel may be solid. In another aspect, the U-shaped or pipe shaped channel may be hollow cylinder shaped. The U-shaped pipe channel may be filled or unfilled. In an embodiment, each wing of the semiconductor channel has a circular cross section when viewed from above. Separate front side and back side methods for fabricating both single vertical channel and U-shaped channel NAND strings are taught in co-pending U.S. patent application Ser. No. 12/827,947, hereby incorporated by reference in its entirety for teaching of the separate front and back side processing methods. Combination front side and back side methods for fabricating both single vertical channel and U-shaped channel NAND strings are taught in co-pending U.S. patent application Ser. No. 13/083,775, hereby incorporated by reference in its entirety for teaching combination front side and back side processing methods.

As used herein, the term "control gate" and "word line" refer to the same electrically conductive entity. A control gate may be considered a portion of a word line located adjacent to and controlling one NAND cell in an array of NAND cells. A word line controls plural NAND cells in the array. Thus, the word line may be considered to be a portion of the electrically conductive entity which connects the control gates. However, it should be understood that the word line and its control gate portions may be formed during the same step and may comprise the same one or more electrically conductive layers as will be described below.

FIGS. 1A-1F illustrate a method of making a three dimensional memory device (e.g., vertical NAND string) according to an embodiment of the invention. In this embodiment, a substrate 100 is provided with a stack of alternating layers of a first material layer 102 and a second material layer 104 formed over the major surface 100a of the substrate 100.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, electrically conductive layers (e.g., electrodes and/or interconnects) over such substrates, or any other semiconducting or non-semiconducting material, such as silicon oxide, glass, plastic, metal or ceramic substrate. The substrate 100 may include integrated circuits fabricated thereon, such as driver circuits for a memory device.

Layers 102 and 104 may be deposited over the substrate 100 by any suitable deposition method, such as sputtering, CVD, PECVD, MBE, etc. Preferably, the first material layer 102 is suitable for use as a control gate. Suitable materials include, but are not limited to, metal (e.g., Al, W, their alloys, etc.) or heavily doped Group IV semiconductor, such as silicon (e.g., polysilicon), silicon germanium, silicon carbide, etc. The semiconductor may be p-type or n-type doped and have a doping concentration between $10^{17}$ cm$^{-3}$ and $10^{21}$ cm$^{-3}$.

The second material layer 104 includes a sacrificial material. Any sacrificial material that may be selectively etched compared to the first material may be used. For example, if the first material layer 102 is p-doped polysilicon, the sacrificial materials 104 may be intrinsic polysilicon (i.e., doping below $10^{16}$ cm$^3$). Alternatively, the second material layer 104 may comprise a metal or an insulating material (e.g., silicon oxide, silicon nitride, etc.) that may be selectively etched with respect to the first mater layer 102. Alternatively, the first layer material 102 may be doped poly silicon and the sacrificial material layer 104 may be SiGe. The stack may be covered with a top layer of insulating material 106, such as silicon oxide or silicon nitride.

In an embodiment, a bottom layer of insulating material 107 may be deposited on the substrate 100 prior to the deposition of the stack of alternating layers of first 102 and second layers 104 and a top layer of insulating material 106 may be deposited over the stack. The top layer of insulating material 106 and the bottom layer of insulating material 107 may be silicon oxide or silicon nitride. In one embodiment, layers 106 and 107 are made of the same material as layers 104 (e.g., silicon oxide). When making the U-shaped channel of an embodiment of the invention, a layer of sacrificial material 111 is preferably deposited in trenches formed in the substrate 100 prior to depositing the stack of alternating layers of first 102 and second layers 104 or the bottom layer of insulating material 107. Layer 111 may be deposited in the trenches in the substrate and over the substrate and then planarized with the top of the substrate surface 100A such that layer 111 remains only in the trenches. Alternatively, layer 111 may be patterned into segments shown in FIG. 1A followed by forming another layer to fill the spaces between the segments. The sacrificial material 111 is preferably different from the second, sacrificial material layer 104. For example, if the second, sacrificial material layer 104 is an oxide, such as silicon oxide, then the sacrificial material 111 may be a nitride, such as silicon nitride. As discussed in more detail below, the sacrificial material 111 may be removed via vertical memory holes etched in the stack of alternating layers of first 102 and second layers 104 and replaced with a semiconductor material to form the horizontal or connecting portion of the U-shaped channel. In an embodiment, an air gap trench may be left between the horizontal portion of the U-shaped channel and the stack such that the connecting portion of the semiconductor channel is located below the air gap.

After deposition of the layers 102 and 104, the stack may be etched to form memory holes 108 and slit trenches 110. The slit trenches 110 may be filled with a sacrificial material 110A, such as silicon nitride or another material which can be selectively etched compared to materials of layer 102 and 104, while the channels of the memory cells are subsequently formed in the memory holes 108. For example, the slit trenches 110 may be formed first using lithography and etching, then the trenches 110 may be filled with the sacrificial material 110A, followed by formation of the memory holes 108 using another lithography and etching step.

When etching conventional stacks having numerous alternating layers 102 and 104, such as eight or more layers, such as 8-64 layers, to form each of the memory holes 108 and the slit trenches 110 with a one step etch process (e.g., with a fluorine based etch) one or more of the memory holes 108 may penetrate through the layer of sacrificial material 111 into bottom conductor layer (not shown) due to a lack of etch selectivity between the materials of the second, sacrificial layers 104 and the sacrificial layer 111. When these memory holes 108 are filled with semiconducting material to form the channels, short circuits are created via semiconductor or conductive portion(s) of the substrate 100.

One conventional method of addressing this problem is to provide a thicker bottom insulating layer 107. However, improvement in the etching profile may to be difficult to achieve with this method. Another conventional method is to etch the layers 102, 104 step by step by alternating with a highly selective etches. However, for large stacks, this method requires a large number separate etch steps which slows throughput and complicates the memory hole 108/slit trench 110 formation steps. Additionally, to achieve high selectivity, high polymerization plasma is used, which may cause to formation of etching stoppages or blockages. Further, this method tends to suffer from higher reactive ion etching (RIE) lag (a phenomena in which smaller trenches etch at a slower rate than larger trenches) and RIE microloading (a phenomena in which the etch rate depends on the pattern density).

The inventors have discovered that with the addition of at least one etch stop layer 109 below the stack of layers 102, 104, large multilayer stacks can be etched using a one step etch process without penetrating through the sacrificial layer 111 into the substrate 100 (e.g., into an electrode in a substrate). In the embodiment illustrated in FIG. 1A, the etch stop layer 109 is located above layer 111, between the substrate 100 and the bottom insulating layer 107. The etch stop layer may be made of a mid-k to high-k metal oxide, such as an aluminum based dielectric (e.g., stoichiometric $Al_2O_3$ or non-stoichiometric aluminum oxide) or a titanium based dielectric (e.g., stoichiometric $TiO_2$ or non-stoichiometric titanium oxide), or nitrogen doped silicon carbide (e.g., silicon carbonitride, SiC(N)) which is resistant to fluorine based plasma. Alternatively, the etch stop layer may comprise aluminum nitride, aluminum oxynitride, silicon carbide or another suitable etch stop material. The etch stop is typically thin, such as 10-70 nm, such as 20-50 nm.

To form the slit trenches 110, a first non-selective slit trench 110 etch is performed through a mask to etch the stack of alternating layers of first and second layers 102, 104 down to the etch stop layer 109. This etch may be performed with either a wet etch, such as phosphoric acid or with a non-selective reactive ion etching process, such as with $NF_3$. Etching with the first non-selective etch is then stopped and the slit trenches 110 are filled with a sacrificial etch stop material 110A. The slit trenches 110 may be filled with any suitable material 110A such as stoichiometric or non-stoichiometric, $AlO_x$, AlN, AlON, SiC, SiCN, TiN and/or $TiO_x$.

A memory hole 108 etch is then performed. A first non-selective memory hole 108 etch is performed through a mask to etch the stack of alternating layers of first and second layers 102, 104 down to the etch stop layer 109. This etch may be performed with either a wet etch, such as phosphoric acid or with a non-selective reactive ion etching process, such as with $NF_3$. A second etch is then performed with an etchant suitable for etching the etch stop layer 109. For example, if the etch stop layer is made of an aluminum based dielectric or a titanium based dielectric, then the etch stop layer 109 may be etched with a chlorine based etchant, such as $Cl_2$ or $BCl_3$. If the etch stop layer is made of SiC(N), then a different fluorine based etchant (e.g., $CF_4$) from that used to etch the first and second layers 102, 104 may be used.

Figure 5:
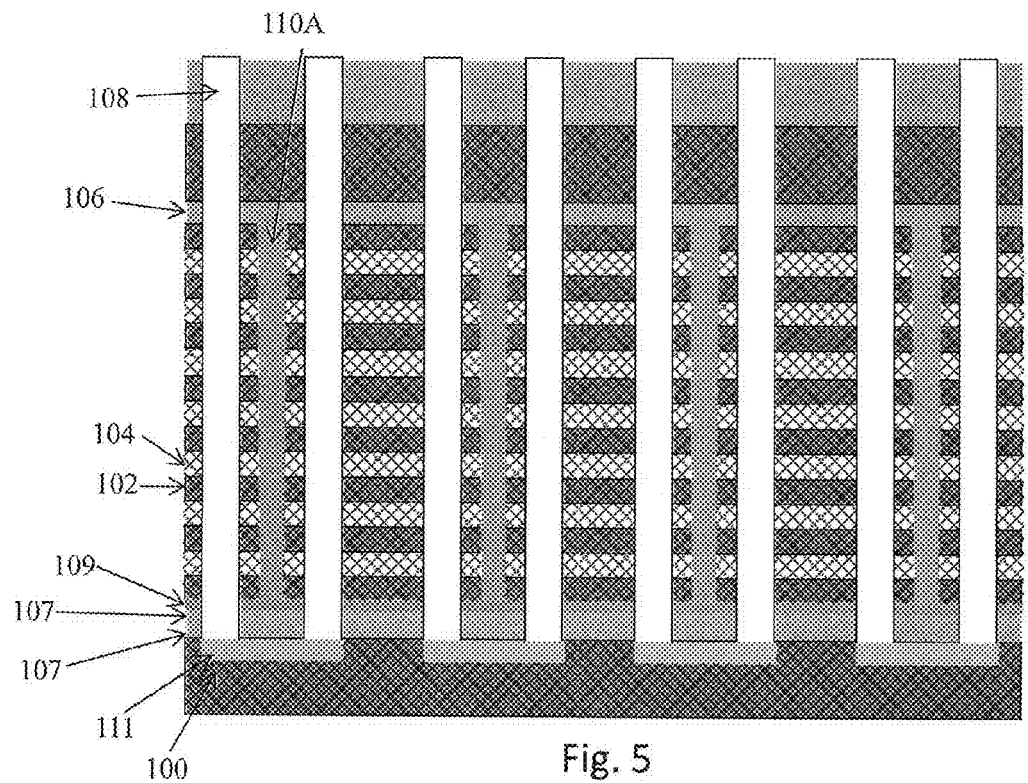
FIG. 5 is a schematic cross sectional side view illustrating a three dimensional memory device according to another embodiment.
Figure 6:
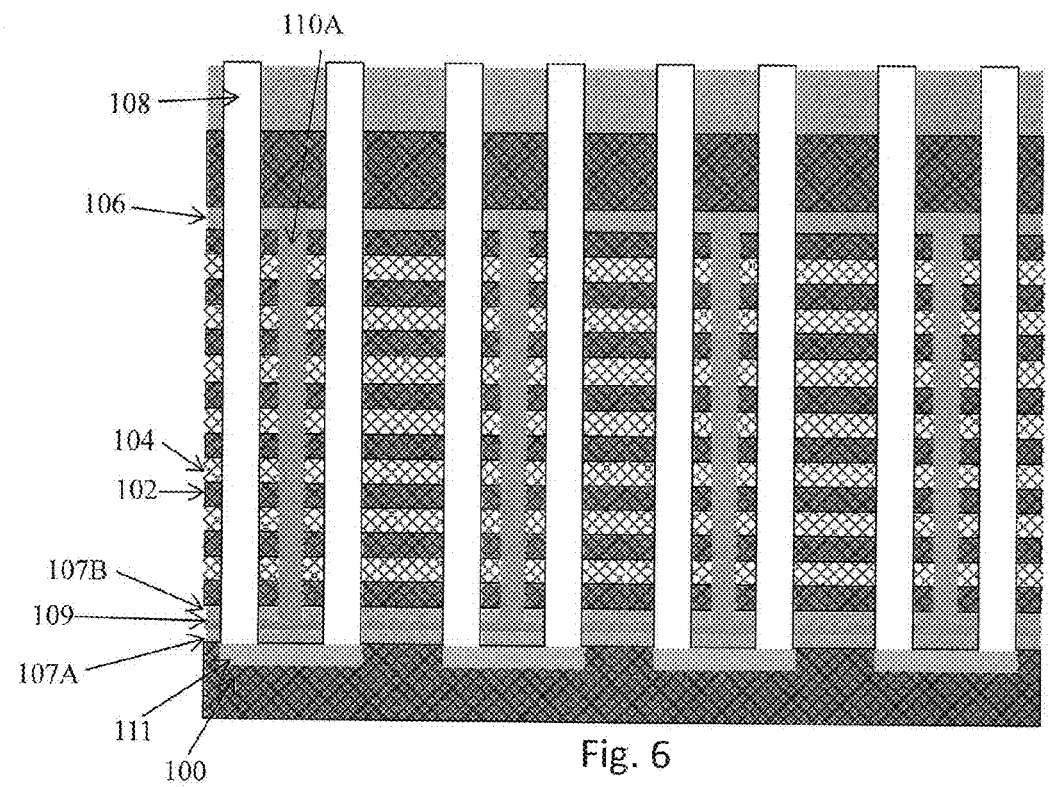
FIG. 6 is a schematic cross sectional side view illustrating a three dimensional memory device according to another embodiment.
Figure 7:
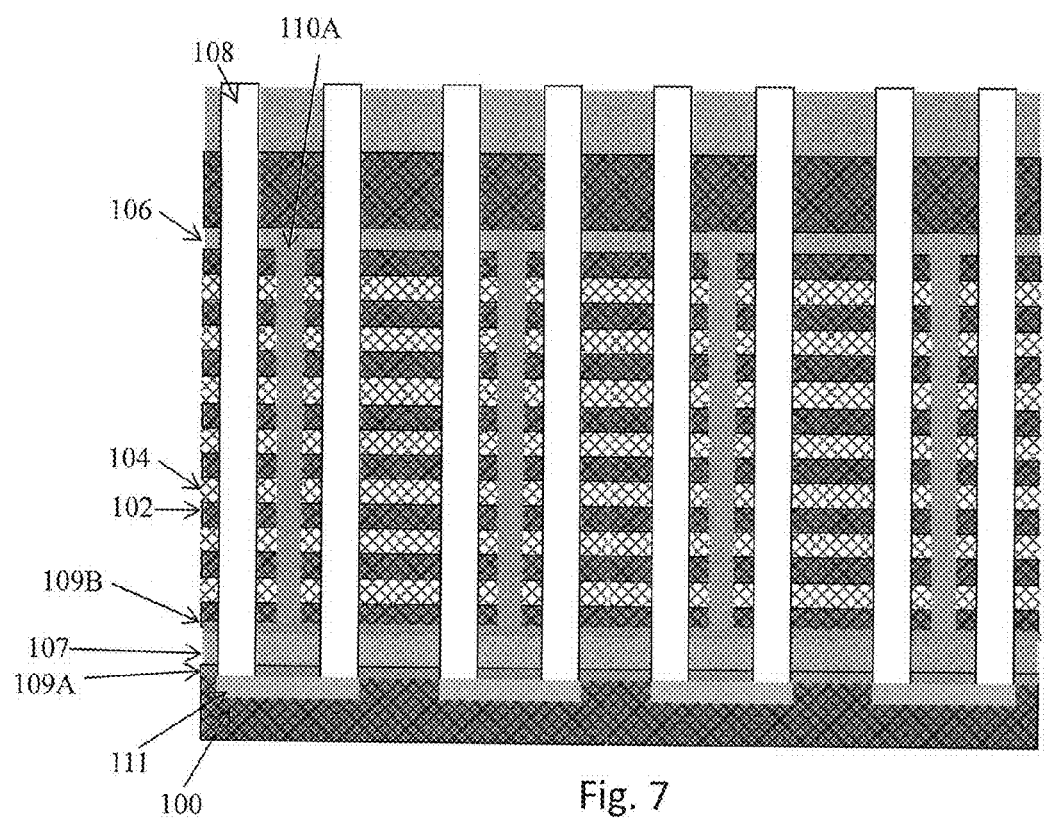
FIG. 7 is a schematic cross sectional side view illustrating an embodiment of a three dimensional memory device with two etch stops.

FIGS. 5-7 illustrate alternative embodiments of the invention. In the embodiment illustrated in FIG. 5, the etch stop layer 109 is located on top of the bottom insulating layer 107. That is, the etch stop layer 109 is located between the bottom insulating layer 107 and the stack of first and second layers 102, 104. In the embodiment illustrated in FIG. 6, the etch stop layer 109 is located in the middle of the bottom insulating layer 107. This may be accomplished by sequentially depositing a first bottom insulating layer portion 107A followed by the etch stop layer 109 and then a second bottom insulating layer portion 107B. Portions 107A and 107B are preferably made of the same material (e.g., silicon oxide). The embodiment illustrated in FIG. 7 includes two etch stop layers 109A, 109B. The first etch stop layer 109A is located between the substrate 100 and the bottom insulating layer 107 while the second etch stop layer 109B is located between the bottom insulating layer 107 and the stack of first and second layers 102, 104. Layers 109A, 109B are preferably made of the same material (e.g., aluminum oxide, titanium oxide or silicon carbonitride).

Figure 1B:
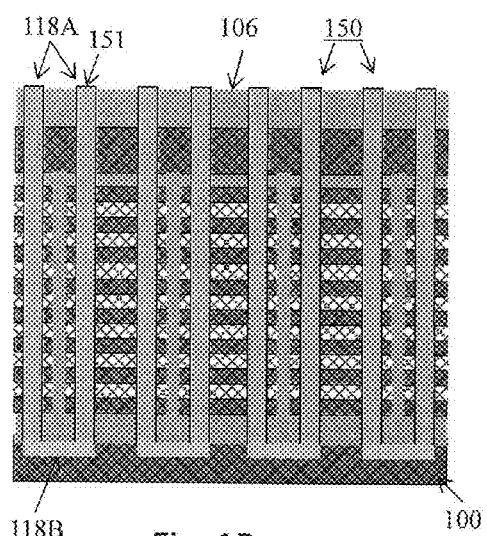
FIG. 1B is a schematic side cross sectional view illustrating another step in the method of making a three dimensional memory device according to an embodiment.

In an embodiment, the memory cells 150 (e.g., vertical NAND strings) may be formed with a series of conformal deposition steps of the memory film and channel column portions 151 of the memory cells 150 in the memory holes 108, as shown in FIG. 1B. Conformal deposition techniques include, but are not limited to, atomic layer deposition (ALD) and chemical vapor deposition (CVD).

Figure 2:
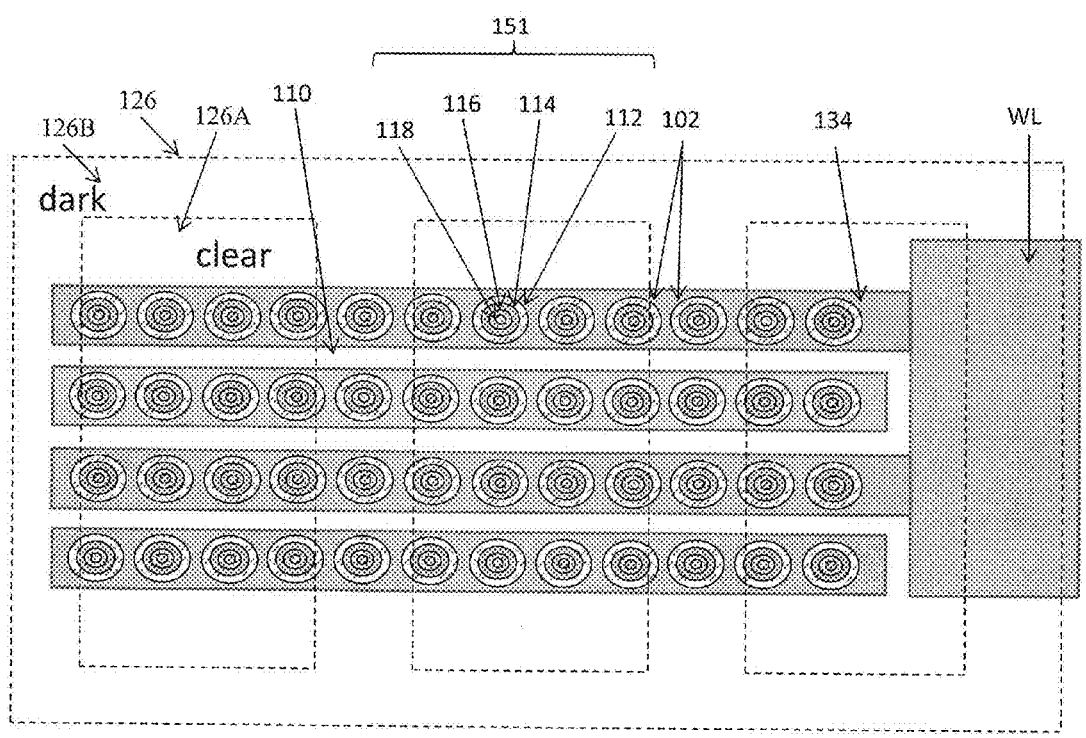
FIG. 2 is a plan view a memory device according to an embodiment. Also illustrated is a support mask layout used in the method of FIG. 1.

For example, as shown in FIG. 2, a layer of blocking dielectric 112 may first be conformally deposited in the memory holes 108. Next, a layer of charge storage or charge trapping material 114 may be conformally deposited on the layer of blocking dielectric 112 in the memory holes 108. A layer of tunnel dielectric 116 may then be conformally deposited on the charge storage material 114 in the memory holes 108. The central portion of the memory hole 108 may then be filled with a semiconductor channel material 118, such as polysilicon.

The channel 118 material may comprise lightly doped p-type or n-type (i.e., doping below $10^{17}$ $cm^{-3}$) semiconductor material (e.g., polysilicon). An n-channel device is preferred since it is easily connected with n+ junctions (i.e., source and drain n+ doped regions having a doping concentration between $10^{17}$ $cm^{-3}$ and $10^{21}$ $cm^{-3}$ located at the opposite ends of each channel). However, a p-channel device may also be used. Other semiconductor materials (e.g., SiGe, SiC, Ge, III-V, II-VI, etc.) may also be used.

The blocking dielectric 112 may comprise a silicon oxide layer deposited by conformal atomic layer deposition (ALD) or chemical vapor deposition (CVD). Other high-k dielectric materials, such as hafnium oxide, may be used instead or in addition to silicon oxide. Dielectric 112 may have a thickness of 6 to 20 nm. The charge storage region 114 may comprise a polysilicon floating gate or a silicon nitride layer deposited by any suitable method, such as ALD, CVD, etc., and have a thickness of 2 to 20 nm. The tunnel dielectric 116 may comprise a relatively thin insulating layer (e.g., 4 to 10 nm thick) of silicon oxide or other suitable material, such as silicon oxynitride, oxide and nitride multi layer stacks, or a high-k dielectric (e.g., hafnium oxide), deposited by any suitable method, such as ALD, CVD. In an alternative configuration, the charge storage material 114 may be formed of a multilayer composite, such as an oxide-nitride-oxide (ONO) multilayer, and/or the blocking dielectric 112 may comprise a tri-layer ONO dielectric.

The result of the conformal depositions is formation of memory cell 150 columns 151 substantially perpendicular to the major surface 100A of the substrate 100. Each memory cell column 151 includes a semiconductor channel core 118, a first shell of tunnel dielectric 116, a second shell of charge storage material 114 and a third shell of blocking dielectric 112. The blocking dielectric layer, the charge storage material (i.e., the charge trapping layer), and a tunnel dielectric layer extend substantially perpendicular to the major surface 110A of the substrate 100 between the semiconductor channel 118 and the plurality of control gate electrodes 102. In an alternative embodiment, the semiconductor channel core 118 may include an inner core of insulating material surrounded by a shell of semiconductor material.

Figure 1C:
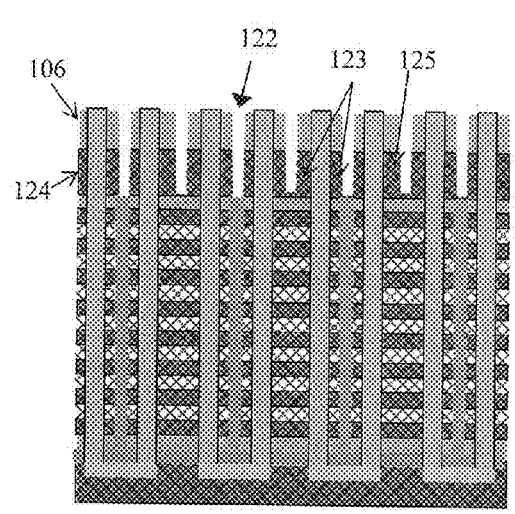
FIG. 1C is a schematic side cross sectional view illustrating another step in the method of making a three dimensional memory device according to an embodiment.
Figure 1D:
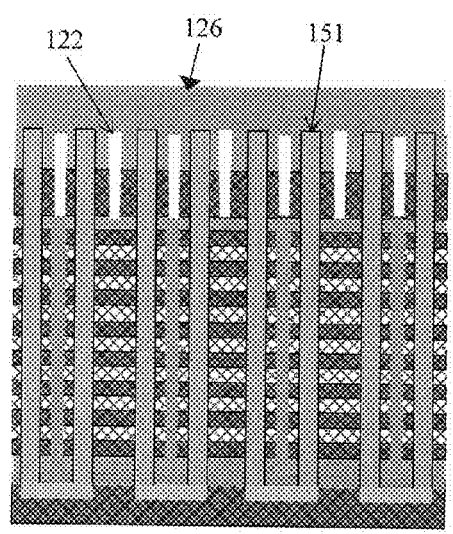
FIG. 1D is a schematic side cross sectional view illustrating another step in the method of making a three dimensional memory device according to an embodiment.
Figure 1E:
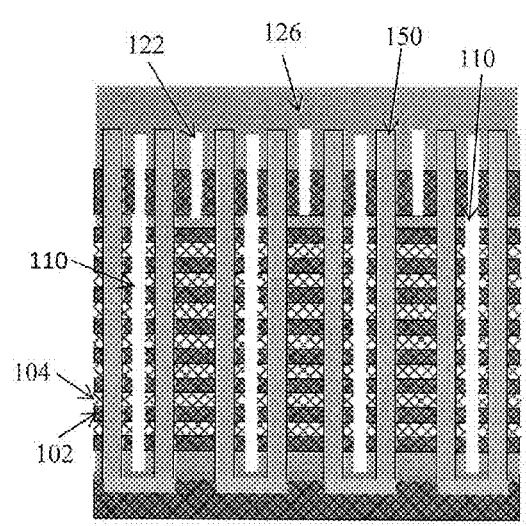
FIG. 1E is a schematic side cross sectional view illustrating another step in the method of making a three dimensional memory device according to an embodiment.
Figure 1F:
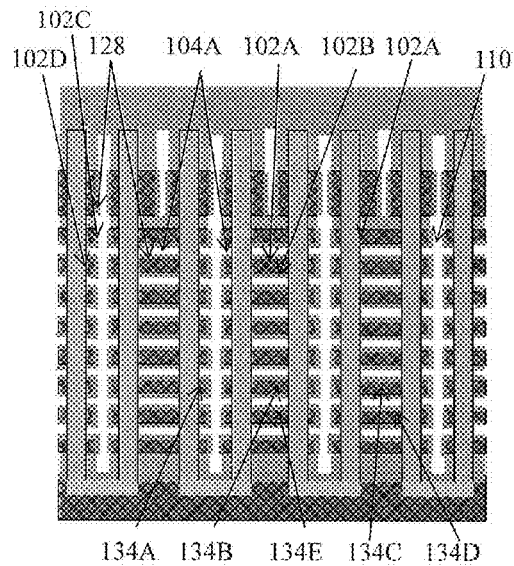
FIG. 1F is a schematic side cross sectional view illustrating another step in the method of making a three dimensional memory device according to an embodiment.

In an embodiment, a surface 102D of the control gate layer 102 directly, physically contacts the blocking dielectric layer 112, as shown in FIGS. 1F and 2.

Figure 3:
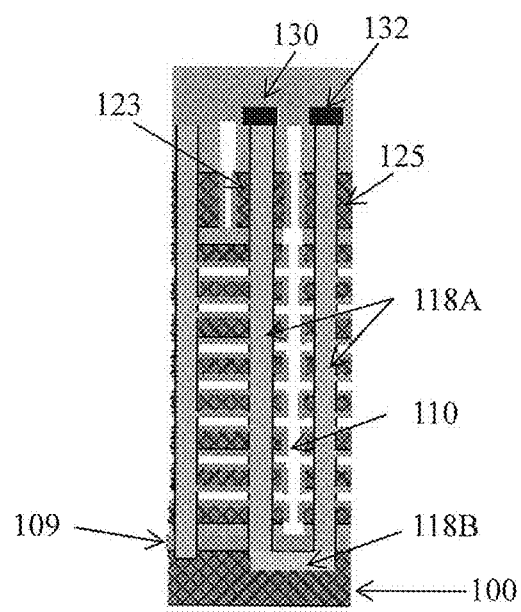
FIG. 3 is a side cross sectional view of a vertical NAND string according to an embodiment.

As illustrated in FIG. 1C, the top layer of insulating material 106 may then be etched to expose openings 122 in a top layer of semiconducting material 124 to form upper select gates 123, 125. The memory cells 150 are configured with U-shaped channels 118 and the select gates include respective drain select gates and source select gates 123, 125 at the upper end of each respective wing portion 118A of the U-shaped channel 118, as shown in FIGS. 1C and 3. The channel wing portions 118A are connected by the horizontal channel 118B located in or on the substrate 100.

In a non-limiting embodiment shown in FIGS. 1D and 2, the control gates are silicided, as described in U.S. patent application Ser. No. 13/443,287, filed on Apr. 10, 2012 and incorporated herein by reference for a teaching of a method of making silicided control gates and the NAND device with such gates. In this embodiment, a support mask 126 may be deposited over the top layer of insulating material 106 after the openings 122 are formed. The support mask 126 provides support to the memory device after the layers of sacrificial materials 110A and 104 are removed. The support mask 126 may be made of any suitable material, such as an oxide or nitride hard mask material. As shown in FIG. 2, the mask 126 may be a mesh shaped mask which includes clear or open gap portions 126A surrounded by dark or solid cross bar mesh support portions 126B.

In the next step, as illustrated in FIG. 1E, the sacrificial material 110A in the slit trenches 110 may be removed. This removal may be accomplished by selectively etching (e.g., wet etching) the sacrificial material 110A in the trenches 110 through the gaps 126A in the mask 126 without etching the other materials or layers in the device. Removing the material 110A in the trenches 110 exposes the side edges of layers of sacrificial material 104 in the stack.

The layers of sacrificial material 104 may then be removed by selective etching (e.g., wet etching) through the slit trenches 110, as illustrated in FIG. 1F. This results in terraces of exposed control gate 102 material which are supported by the memory cell columns 151. The support mask 126 provides additional support to the memory cell columns 151. The control gates 102 are separated in the vertical direction by the air gaps 104A where the sacrificial material layers 104 were previously located and in the horizontal direction by the slit trenches 110.

After formation of the air gaps 104A, the exposed surfaces of the control gates 102 may be silicided to form a silicide layer 128 on the exposed surfaces of the polysilicon control gates 102. The silicide layer 128 may be formed by conformally depositing a thin layer of metal, such as tungsten, cobalt, nickel or titanium, or a combination of two more of these metals, on the exposed control gate polysilicon material and heating the device to react the thin layer of metal with the control gate material. The metal layer may be formed through the gaps 126A in the mask 126 and through the trenches 110 and air gaps 104A. The silicide layer 128 may be formed on the upper 102A and lower 102B surfaces of the exposed control gates 102 as well as on the exposed face 102C of the control gate 102 opposite the face 102D that contacts the charge storage region 112 of the memory device 150. The upper and lower surfaces 102A, 102B of the control gates 102 are positioned substantially parallel to the major surface 100A of the substrate 100, while edge surfaces or faces 102C, 102D of the control gate 102 are positioned substantially perpendicular to the major surface 100A of the substrate 100. The silicide layer 128 may also be formed on the side wall of the select gates 123, 125 exposed in the trenches 122.

In an alternative embodiment, the mask 126 and silicide layer 128 may be omitted. Furthermore, the air gaps 104A and/or air gap slit trenches 110 may be omitted and instead layers 104 and/or trench etch stop material 110A may remain in the completed device.

In the completed device, the each memory cell includes a source electrode 130 and a drain electrode 132. Methods of making the source electrode 130 and a drain electrode 132 are described in co-pending U.S. patent application Ser. Nos. 12/827,947 and 13/083,775, hereby incorporated by reference. In a U-shaped channel configuration shown in FIG. 3, both the source and drain electrodes 132, 130 may be formed contacting the source and drain regions at the top of the wings 118A of the vertical memory column(s) 151.

Figure 4:
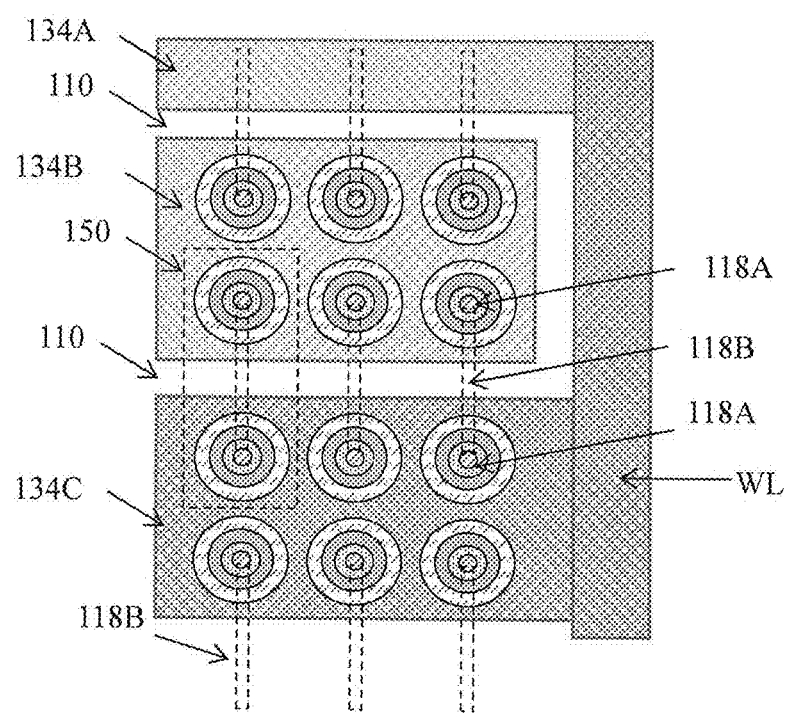
FIG. 4 is a plan view of a memory device according to an embodiment.

As illustrated in FIGS. 2 and 4, the control gates 102 in adjacent memory cells 150 in a device level may be connected to each other in a strip 134. The strips 134 connected to a given word line may be combed shaped and strips connected to adjacent word lines may be interdigitated as shown in FIG. 2. As noted above, the strips 134 and individual control gates 102 may be considered portions of the word line rather than discreet elements.

In the embodiment illustrated in FIG. 2, the control gate strips 134 surround a single row of memory cell 150 pillars 151. As illustrated in FIG. 4, each control gate 102 strip 134 may surround two rows of pillars 151 (i.e., wings 118A) of adjacent NAND strings (i.e., memory cells) 150.

In the U-shaped channel configuration of FIG. 3, the horizontal channel portion 118B of the U-shaped channel 118 connects adjacent channel wing portions 118A under the slit trenches 110 under the etch stop layer 109, as shown in FIGS. 3 and 4. Thus, the horizontal portion 118B of the U-shaped channel 118 extends substantially perpendicular to the elongation direction of the strips 134 of control gates 102. The source select gates 123 of adjacent memory cells may be connected to each other via a source line while the drain select gates 125 of adjacent memory cells may be connected to each other via a bit line (not shown). While the U-shaped NAND strings 150 are illustrated with the control gate strip 134 surrounding two rows of pillars 151 configuration of FIG. 4, it should be understood that the U-shaped NAND strings 150 may also be used with the control gate strip 134 surrounding one row of pillars 151 configuration of FIG. 2.

FIG. 4 illustrates three control gate strips 134A, 134B and 134C located in the same device level. Control gate strip 134B is located between strips 134A and 134C. Control gate strips 134A and 134C are electrically connected to the same word line WL, while control gate strip 134B is electrically connected to a different word line (not shown), such that strip 134B is interdigitated between strips 134A and 134C in the same device level. The strips 134A, 134B and 134C are separated from each other by air gap trenches 110. A first wing portion 118A of the semiconductor channel 118 of the NAND string 150 (shown by dashed lines) extends through and is surrounded by strip 134C (as well as other strips located above and below strip 134C, such as strip 134D shown in FIG. 1F). The second wing portion 118A of the semiconductor channel 118 extends through and is surrounded by strip 134B (as well as other strips located above and below strip 134B, such as strip 134E shown in FIG. 1F). The connecting portion 118B (shown in dashed lines) of the semiconductor channel 118 is located below the air gap trench 110 which separates the strips.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:
    forming a sacrificial feature over a substrate;
    forming an etch stop layer over the sacrificial feature;
    forming a stack of alternating layers of a first material and a second material over the substrate, wherein the first material comprises a conductive or semiconductor control gate material and wherein the second material comprises an insulating material;
    etching the stack to form a slit trench up to or only partially through the etch stop layer;
    filling the slit trench with a sacrificial material;
    etching the stack to form at least one opening in the stack at least to the etch stop layer using a first etch chemistry; and
    further etching the at least one opening through the etch stop layer to the sacrificial feature using a second etch chemistry, wherein the second etch chemistry is different from the first etch chemistry.

2. The method of claim 1, wherein the etch stop layer comprises aluminum oxide, aluminum nitride, aluminum oxynitride, titanium oxide, silicon carbide or silicon carbonitride.

3. The method of claim 2, wherein the first material comprises polysilicon and the second material comprises silicon oxide.

4. The method of claim 3, wherein the first etch chemistry comprises a fluorine based plasma etch chemistry and the second etch chemistry comprises a chlorine based plasma etch chemistry or a fluorine based plasma chemistry different from that of the first etch chemistry.

5. The method of claim 4, wherein the first etch chemistry comprises a $NF_3$ dry etch chemistry and the second etch chemistry comprises a dry $CF_4$, $Cl_2$ or $BCl_3$ etch chemistry.

6. The method of claim 5, wherein the sacrificial feature and the sacrificial material comprise silicon nitride, and wherein a silicon oxide layer is located above or below the etch stop layer.

7. The method of claim 1, further comprising:
forming a blocking dielectric in the at least one opening;
forming a charge storage layer over the blocking dielectric;
forming a tunnel dielectric over the charge storage layer; and
forming a semiconductor channel over the tunnel dielectric.

8. The method of claim 7, wherein:
the at least one opening comprises two openings extending to the sacrificial feature; and
the slit trench is located between the two openings.

9. The method of claim 8, further comprising removing the sacrificial feature through the two openings while the slit trench is filled with the sacrificial material to form a hollow region extending substantially parallel to a major surface of the substrate which connects the at least two openings to form a hollow U-shaped pipe space comprising the two openings extending substantially perpendicular to the major surface of the substrate connected by the hollow region.

10. The method of claim 9, wherein forming the semiconductor channel comprises forming the semiconductor channel in the hollow U-shaped pipe space such that the semiconductor channel has a U-shaped side cross section, comprising:
two wing portions which extend substantially perpendicular to the major surface of the substrate through the etch stop layer;
a connecting portion which extends substantially parallel to the major surface of the substrate below the etch stop layer and which connects the two wing portions; and
the semiconductor channel has a cross section of two circles when viewed from above.

11. The method of claim 10, further comprising removing the sacrificial material from the slit trench to form an air gap trench which separates the two wing portions.

12. The method of claim 11, wherein:
removing the sacrificial feature comprise selectively wet etching the sacrificial feature; and
removing the sacrificial material comprises selectively wet etching the sacrificial material.

13. The method of claim 12, wherein the sacrificial feature comprises silicon nitride and the selectively wet etching comprises selectively wet etching the sacrificial feature using phosphoric acid.

14. The method of claim 10, furthering comprising forming a source electrode contacting the first wing and forming a drain electrode contacting the second wing.

* * * * *